United States Patent
Tandy

(10) Patent No.: US 7,216,425 B2
(45) Date of Patent: *May 15, 2007

(54) METHOD OF FORMING A NON-CONTINUOUS CONDUCTIVE LAYER FOR LAMINATED SUBSTRATES

(75) Inventor: Patrick W. Tandy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 138 days.

This patent is subject to a terminal disclaimer.

(21) Appl. No.: 10/804,952

(22) Filed: Mar. 19, 2004

(65) Prior Publication Data

US 2004/0172821 A1    Sep. 9, 2004

Related U.S. Application Data

(62) Division of application No. 09/968,564, filed on Oct. 1, 2001, now Pat. No. 6,729,024, which is a division of application No. 09/634,064, filed on Aug. 8, 2000, now Pat. No. 6,429,385.

(51) Int. Cl.
*H05K 3/02* (2006.01)

(52) U.S. Cl. .......................... 29/847; 29/846; 29/830; 174/250; 174/262; 361/748

(58) Field of Classification Search ......... 29/825–830, 29/846–852; 174/52.1, 250, 260–264; 361/748, 361/764, 777; 438/112, 121, 122; 257/701
See application file for complete search history.

(56) References Cited

U.S. PATENT DOCUMENTS

| | | |
|---|---|---|
| 3,357,099 A | 12/1967 | Nagy et al. |
| 4,567,545 A | 1/1986 | Mettler, Jr. |
| 4,772,936 A | 9/1988 | Reding et al. |
| 5,061,988 A | 10/1991 | Rector |
| 5,218,172 A | 6/1993 | Seidel |
| 5,253,415 A | 10/1993 | Dennis |
| 5,288,949 A | 2/1994 | Crafts |
| 5,552,567 A | 9/1996 | Peterson et al. |
| 5,773,764 A | 6/1998 | von Vajna |
| 5,831,218 A | 11/1998 | Hu et al. |
| 5,841,194 A * | 11/1998 | Tsukamoto ................. 257/729 |
| 5,915,755 A | 6/1999 | Gochnour et al. |
| RE36,325 E | 10/1999 | Corbett et al. |
| 5,979,044 A | 11/1999 | Suma et al. |
| 6,013,541 A | 1/2000 | Tan et al. |
| 6,066,512 A * | 5/2000 | Hashimoto ................. 438/112 |
| 6,204,559 B1 | 3/2001 | Lin et al. |
| 6,239,380 B1 | 5/2001 | Drussel et al. |
| 6,429,385 B1 * | 8/2002 | Tandy ........................ 174/260 |
| 6,729,024 B2 * | 5/2004 | Tandy ........................ 29/847 |

* cited by examiner

*Primary Examiner*—Minh Trinh
(74) *Attorney, Agent, or Firm*—Dinsmore & Shohl LLP

(57) ABSTRACT

A method of fabricating a circuit board is provided that includes forming a first layer of conductive material over an insulating layer, removing portions of the conductive material to define a first circuit pattern and a first rail area that is electrically isolated from the first circuit pattern, and removing portions of the conductive material from the first rail area. Optionally, the first rail area is positioned generally adjacent to a first edge of the circuit board and spans at least a portion of the length of the first edge. Optionally, portions of the conductive material of the first layer are removed to define a second rail area that is electrically isolated from the first circuit pattern and the first rail area, and portions of the conductive material of the first layer are also removed from the second rail area.

7 Claims, 7 Drawing Sheets

METHOD OF FORMING A NON-CONTINUOUS CONDUCTIVE LAYER FOR LAMINATED SUBSTRATES

CROSS-REFERENCE TO RELATED APPLICATIONS

This is a divisional application of application Ser. No. 09/968,564, filed Oct. 1, 2001 now U.S. Pat. No. 6,729,024 and entitled "METHOD OF FORMING A NON-CONTINUOUS CONDUCTIVE LAYER FOR LAMINATED SUBSTRATES", which is a divisional application of application Ser. No. 09/634,064, filed Aug. 8, 2000 and entitled "NON-CONTINUOUS CONDUCTIVE LAYER FOR LAMINATED SUBSTRATES", now U.S. Pat. No. 6,429,385. This application is also related to application Ser. No. 10/210,219, filed Aug. 1, 2002 and entitled "NON-CONTINUOUS CONDUCTIVE LAYER FOR LAMINATED SUBSTRATES", which is a continuation application of application Ser. No. 09/634,064, now U.S. Pat. No. 6,429,385.

FIELD OF THE INVENTION

The present invention relates to the field of circuit board and substrate manufacture and, more particularly, to a non-continuous conductive layer for laminated substrates.

BACKGROUND OF THE INVENTION

Circuit boards and printed circuit boards (PCB) are commonly used in electronic devices of today. Many electronic devices, such as motherboards, memory devices, video adaptors, network cards and the like are created using circuit boards.

Generally, a circuit board is a flat piece of insulating material such as fiberglass, epoxy or phenolic resin, on which electrical components are mounted and interconnected to form a circuit. The flat piece of insulating material forms the substrate. A laminated circuit board is a circuit board in which a conductive layer is laminated onto an insulating layer. Circuit boards or PCBs have multiple conductive paths or interconnects to provide electrical connections among circuit components on the board. FIG. 1A shows a typical laminated circuit board having a copper layer laminated onto a fiberglass layer. This circuit board or substrate has a thickness of 0.010 inches, a length of 7.2 inches and a width of 1 inch. FIG. 1B shows a typical laminated circuit board having a fiberglass layer sandwiched between two metal layers such as copper. This circuit board has a thickness of 0.012 inches, a length of 7.2 inches and a width of 1 inch. Circuit boards are commonly used for devices such as memory devices, module boards, video cards, sound cards and the like.

The connections between components on a circuit board are typically created by using photolithography. The circuit pattern is drawn, photographed, and reduced to a negative having the desired final size. This negative is called the photomask or mask. Light is passed through the mask onto a substrate having a conductive layer that has been coated with a photoresistive material. Where light strikes the photoresistive material, its composition is changed. In the next step, the photoresistive material not affected by light is washed off. Finally, the circuit board is exposed to an etching solution that eats away the parts of the conductive layer not protected by the photoresistive material, creating the desired circuit pattern on the surface of the circuit board.

Standard substrates are used for circuit boards and devices such as memory devices. Minor defects or deformations in these substrates or circuit boards can have a significant impact on further processing of the circuit board which includes attaching components, such as integrated circuits, to the circuit board. Processing requires strict tolerances and even minor deformations can damage equipment or render a circuit board useless. For example, even a $\frac{1}{16}"-\frac{1}{8}"$ bow in a substrate for a dual in line memory module (DIMM) can cause problems in processing the module.

FIG. 2 shows a typical circuit board after it has been patterned. After a circuit board is patterned, circuit boards typically include lengths of conductive material along each edge of the circuit board, from one end to the other end. These lengths of conductive material are called rails and are shown in FIG. 2 as a first rail 201 and a second rail 202. The rails 201 and 202 are formed as a result of the patterning. The conductive material can be a metal such as copper. Conductive materials have a property that once they are deformed or bent, they "remember" that deformation. For example, once a piece of copper is bent a certain way, the piece will have a tendency to bend that certain way even after it is bent a different way. Because of the rails, these circuit boards or substrates have a tendency to remember any deformation that they are subjected to. Circuit boards encounter thermal cycling during processing which causes the expansion and contraction of the substrate. This can result in circuit boards that are warped or deformed.

What is needed is a way to reduce warping or deforming of circuit boards during processing.

SUMMARY OF THE INVENTION

A method for fabricating a circuit board having a non-continuous conductive layer is disclosed. A conductive layer is laminated onto an insulating layer. A pattern is etched on the conductive layer to eliminate continuous lengths of conductive material.

A method for fabricating a circuit board is disclosed. A conductive layer is formed over an insulating layer. The conductive layer has a first rail area, a pattern area and a second rail area. The pattern area of the conductive layer is patterned. Conductive material from the first and second rail areas is removed.

A module board is disclosed. The module board includes a circuit board, a pattern and rails. The circuit board has a conductive layer of a conductive material laminated to an insulating layer. The pattern is etched onto the substrate. The rail is located along a first and second length of the substrate. The rail is an area not etched from the pattern. Conductive material is at least partially removed from the rails to remove continuous lengths of conductive material from the circuit board.

Other methods, systems and devices are disclosed.

DETAILED DESCRIPTION OF THE INVENTION

The term "patterning" refers to one or more steps that result in the removal of selected portions of layers. The patterning process is also known by the names photomasking, masking, photolithography and microlithography. The term "circuit board" refers to a flat piece of insulating material, such as epoxy or phenolic resin, on which electrical components are mounted and interconnected.

Figure 1A:
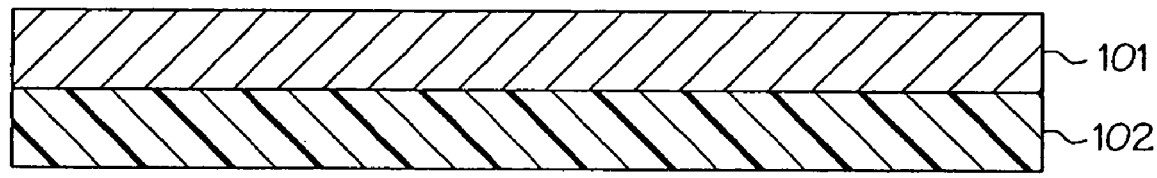
FIG. 1A is a cross sectional illustration of a typical laminated circuit board substrate having a copper layer laminated onto a fiberglass layer.
Figure 1B:
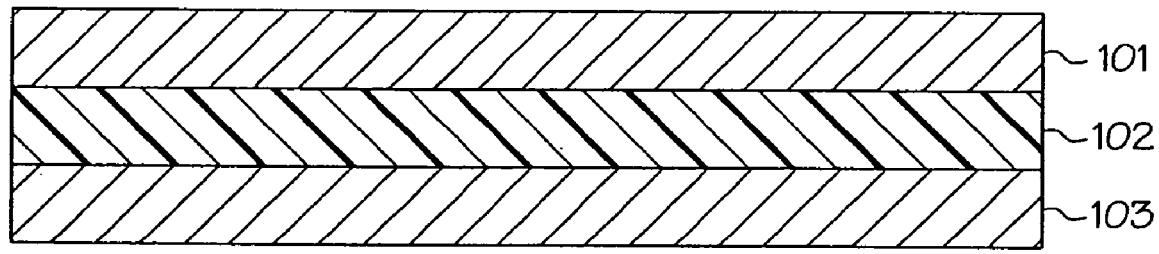
FIG. 1B is a cross sectional illustration of a typical laminated circuit board substrate having a fiberglass layer sandwiched between two metal layers.
Figure 2:
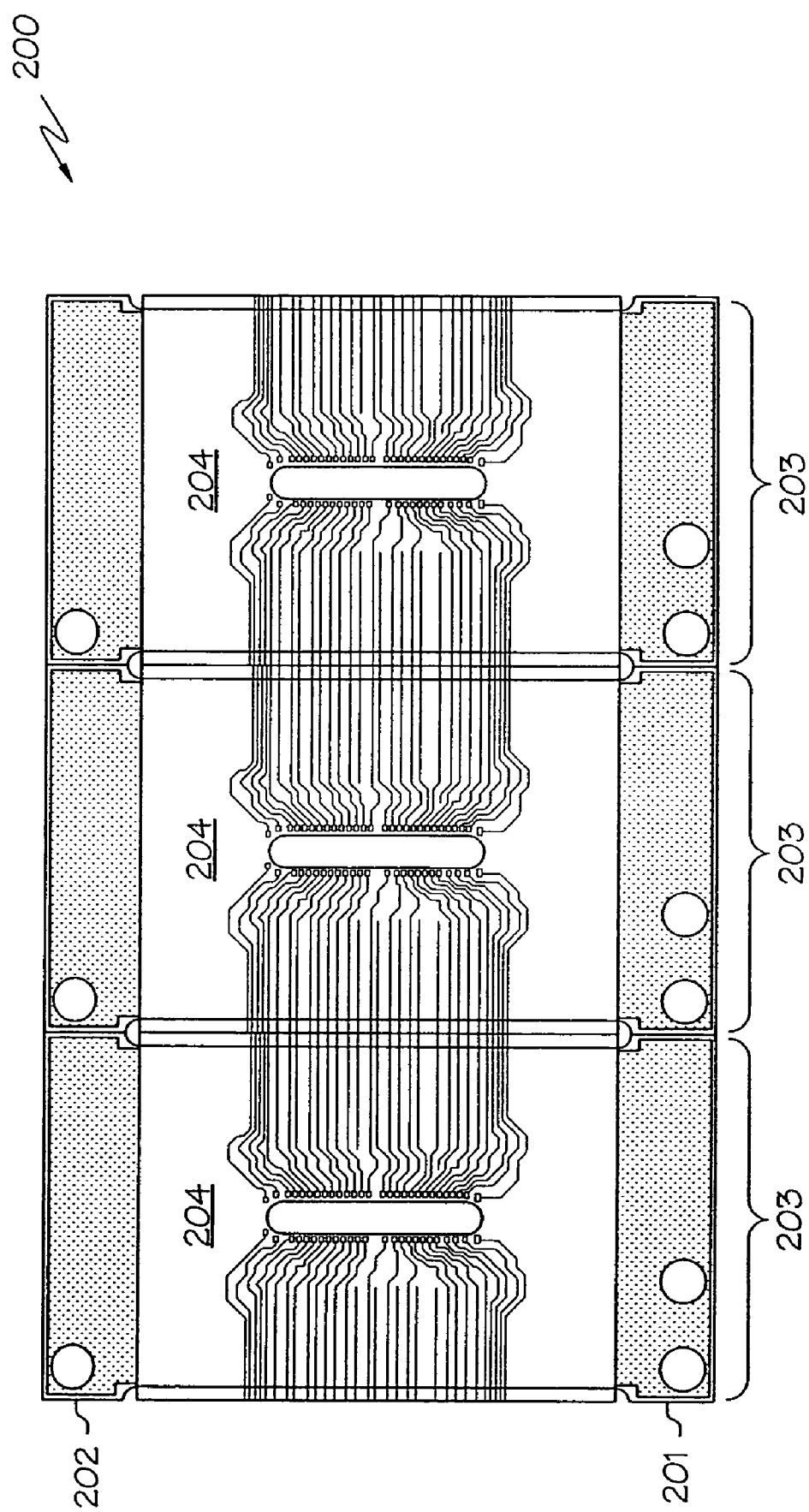
FIG. 2 is an illustration of a typical circuit board.

As stated earlier, FIG. 2 is an example of a standard circuit board 200 used for memory devices such as dual in line memory modules (DIMMs). The circuit board includes a first rail 201, a second rail 202, a number of sites 203 and a patterned area 204. A rail is an area along the edge of a circuit board. The rails 201 and 202 do not generally contain conductive paths, bonding pads or the like. Thus, the rails 201 and 202 do not get etched and conductive material is not removed from the rails 201 and 202. The rails 201 and 202 include a large amount of conductive material such as copper. The conductive material stretches from one end of the substrate to the other. FIG. 2 only shows 3 die sites or sites, however any number of sites such as 12 can be on a single circuit board. A site is a location where an integrated circuit is attached to the substrate, typically by soldering. The patterned area 204 is the area where electrical interconnects and bonding pads are formed by etching away conductive material. The patterned area 204 is adjacent to the first rail 201 and the second rail 202. The circuit board 200 of FIG. 2 is susceptible to deformation and warping due to expansion and contraction of the circuit board during thermal cycling. This circuit board has a tendency to remember any deformation that it is subjected to and can cause errors in processing.

Figure 3A:
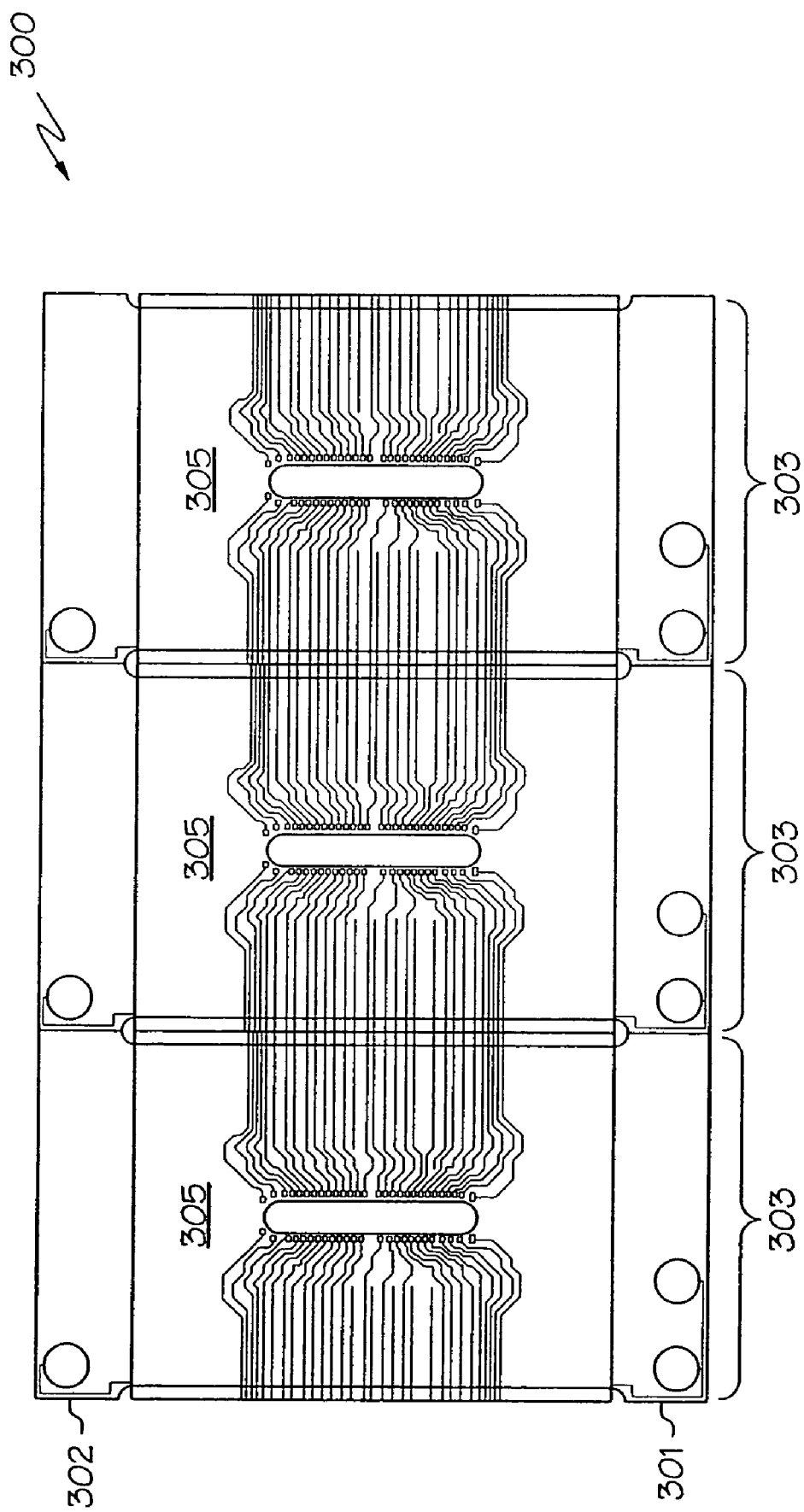
FIG. 3A is an illustration of a laminated circuit board according to the present invention.

FIG. 3A is a laminated circuit board 300 according to one embodiment of the invention. The circuit board 300 includes a first rail 301, a second rail 302, a number of sites 303 and a patterned area 305. The patterned area 305 is adjacent to the first rail 301 and the second rail 302. Even though there are only 3 sites 303 shown in FIG. 3, the invention is not limited to a specific number of sites. The first rail 301 and the second rail 302 have had all conductive material removed and thus, no conductive material remains. The patterned area 305 is the area where electrical interconnects and bonding pads are formed by etching away conductive material. A conductive material commonly used is copper, however other conductive materials may be used in the circuit board. By having the conductive material removed from the rails 301 and 302, this circuit board 300 has a reduced tendency to warp or deform.

Figure 3B:
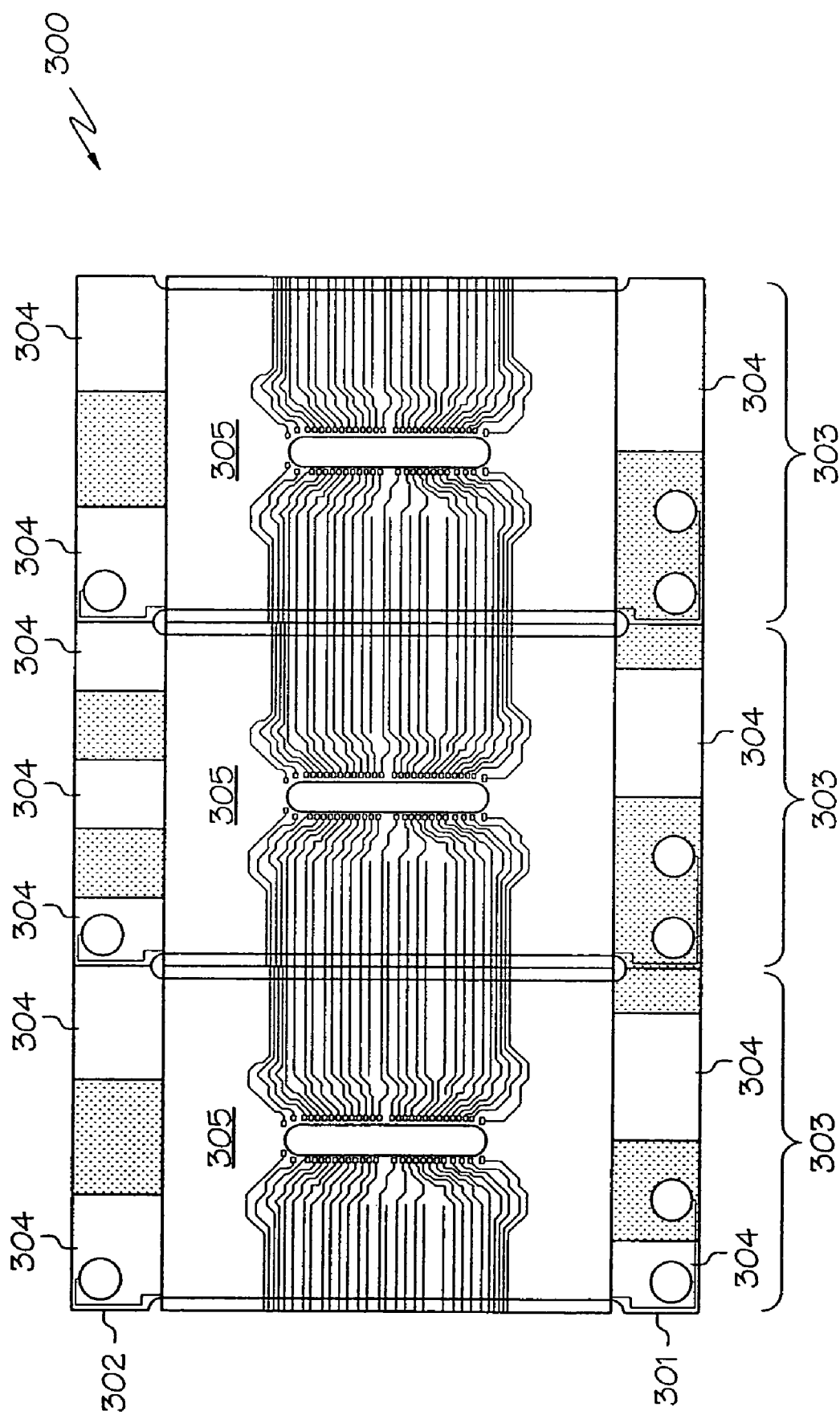
FIG. 3B is an illustration of a laminated circuit board according to the present invention.

FIG. 3B is a laminated circuit board 300 according to one embodiment of the invention. The circuit board 300 includes a first rail 301, a second rail 302, a number of sites 303 and a patterned area 305. The patterned area 305 is adjacent to the first rail 301 and the second rail 302. Even though there are only 3 sites 303 shown in FIG. 3, the invention is not limited to a specific number of sites. The first rail 301 and the second rail 302 have had gaps 304 of conductive material removed and thus, no continuous lengths of conductive materials remain. The patterned area 305 is the area where electrical interconnects and bonding pads are formed by etching away conductive material. A conductive material commonly used is copper, however other conductive materials may be used in the circuit board. By having the gaps 304 of conductive material removed from the rails 301 and 302, this circuit board 300 has a reduced tendency to warp or deform.

Figure 4A:
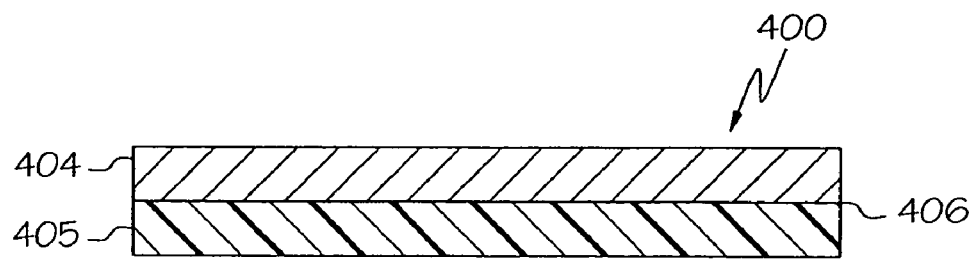
FIG. 4A is an illustration of a side view of a module board according to the present invention.

FIG. 4A is a side view of a module board 400 according to one embodiment of the invention. The module board 400 has a top 406 and is fabricated on a laminated circuit board having an insulating layer 405 and a conductive layer 404 laminated onto the insulating layer. For the purposes of describing and defining the present invention, a module board is any electronic device made from a circuit board such as video cards, sound cards, memory devices, mother boards, network cards and the like. The conductive layer 404 is made from a conductive material such as copper. The insulating layer 405 is made from an insulating material such as fiberglass.

Figure 4B:
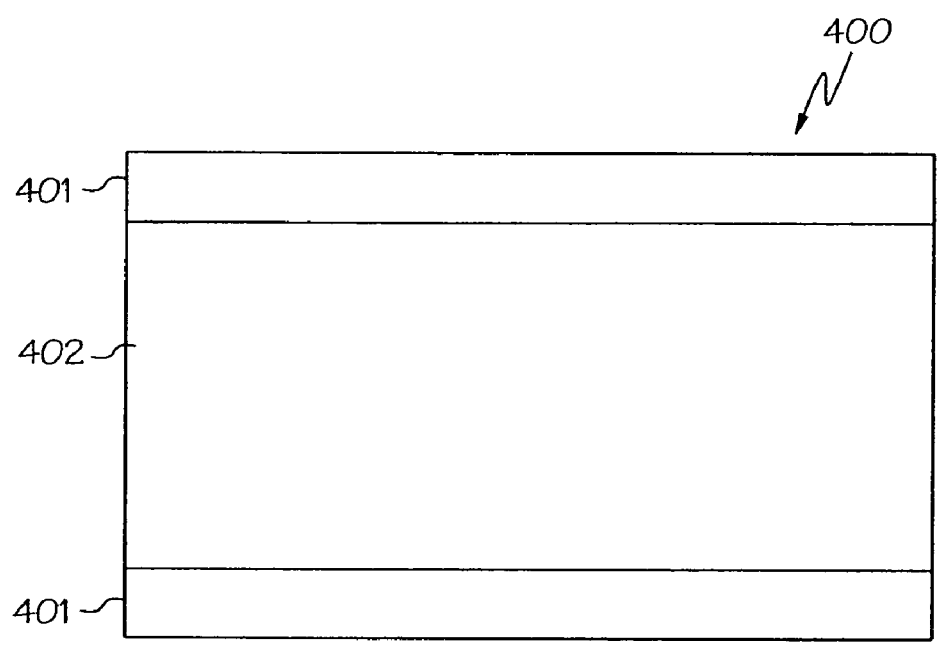
FIG. 4B is an illustration of a top view of a module board according to the present invention.

FIG. 4B is top view of a module board 400 according to one embodiment of the invention. The module board 400 can be any number of electronic devices such as video cards, sound cards, network cards and the like. For this embodiment, the module board 400 includes a pattern area 402 in between two rail areas 401. Alternate embodiments may have one rail or no rails. The pattern 402 is etched onto the substrate of the module board 400. The pattern creates the desired conductive connections, leads and pads on the board 400. A mask or photomask may be used to etch the pattern so as to remove conductive material. After the pattern 402 is etched, rails 401 along each edge remain and the rails 401 have not had conductive material removed during patterning. The rails 401 are partially etched or completely etched so that no continuous lengths of conductive material remains from one end of the board 400 to the other. To remove continuous lengths of conductive material from the rails 401, all of the conductive material in the rail may be removed or gaps of removed conductive material in the rail could be created. The module board 400 can be further processed by connecting integrated circuits and devices while having a reduced tendency to deform or warp compared to boards having continuous lengths of such a conductive material.

Figure 4C:
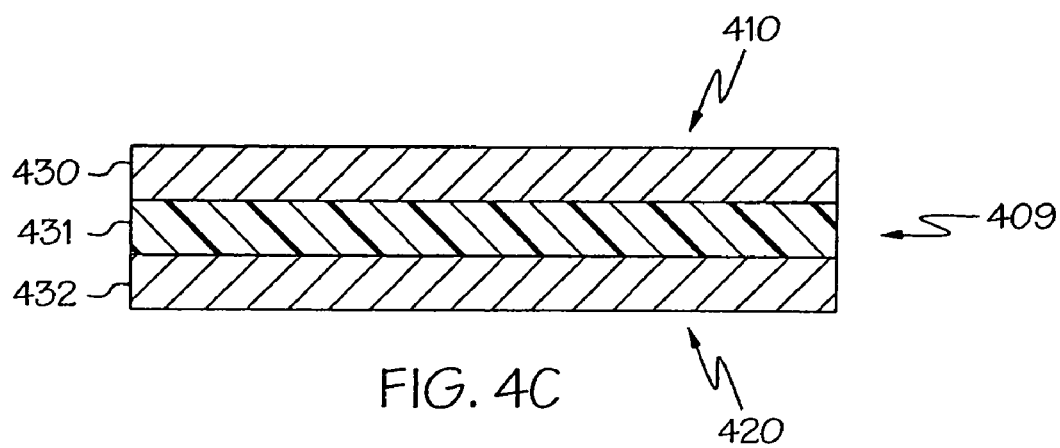
FIG. 4C is an illustration of a side view of a dual sided module board according to the present invention.

FIG. 4C is a side view of a dual sided module board 409 according to one embodiment of the invention. The module board 409 has a top 410 and a bottom 420. The module board 409 is fabricated on a laminated circuit board comprised of a top conductive layer 430 laminated onto an insulating layer 431 laminated onto a bottom conductive layer 432. For the purposes of describing and defining the present invention, a module board is any electronic device made from a circuit board such as video cards, sound cards, memory devices, mother boards, network cards and the like. The conductive layers 430 and 432 are made from a conductive material such as copper. The insulating layer 431 is made from an insulating material such as fiberglass.

Figure 4D:
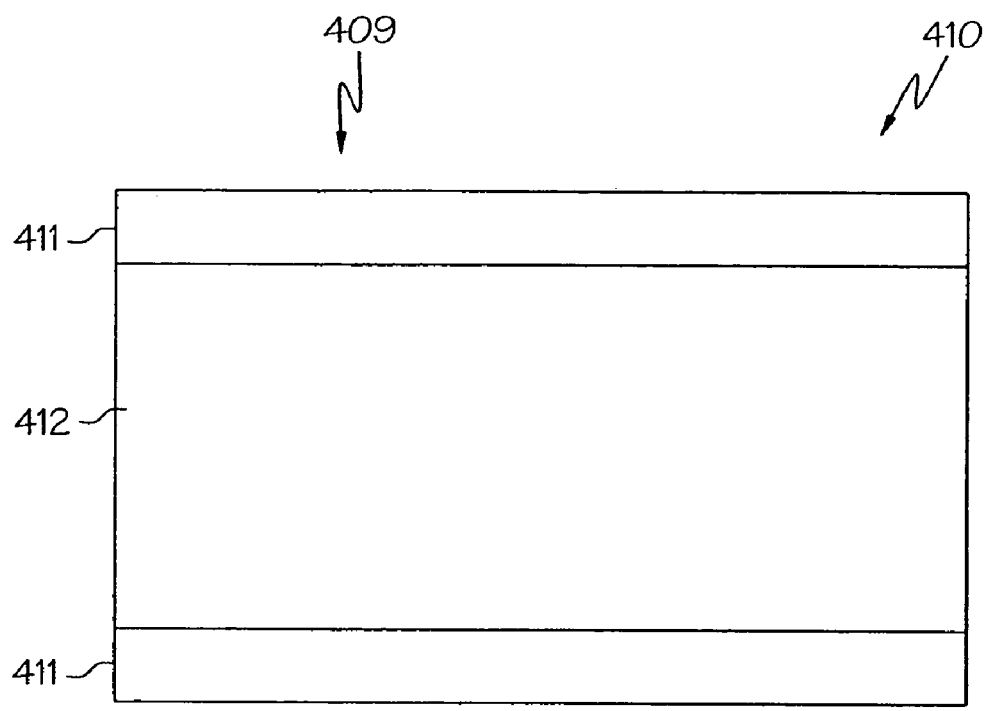
FIG. 4D is an illustration of a top view of a dual sided module board according to the present invention.

FIG. 4D is top view of a dual sided module board 409 according to one embodiment of the invention. The module board 409 can be any number of electronic devices such as video cards, sound cards, network cards and the like. The module board 409 includes a pattern area 412 in between two rail areas 411. The pattern 412 is etched onto the substrate of the module board 409. The pattern creates the desired conductive connections, leads and pads on the board 409. A mask or photomask may be used to etch the pattern so as to remove conductive material. After the pattern 412 is etched, rails 411 along each edge remain and the rails 411 have not had conductive material removed during patterning. The rails 411 are partially etched or completely etched so that no continuous lengths of conductive material remains from one end of the board 409 to the other. To remove continuous lengths of conductive material from the rails 411, all of the conductive material in the rail may be removed or gaps of removed conductive material in the rail could be created. The module board 409 can be further processed by connecting integrated circuits and devices while having a reduced tendency to deform or warp compared to boards having continuous lengths of such a conductive material.

Figure 4E:
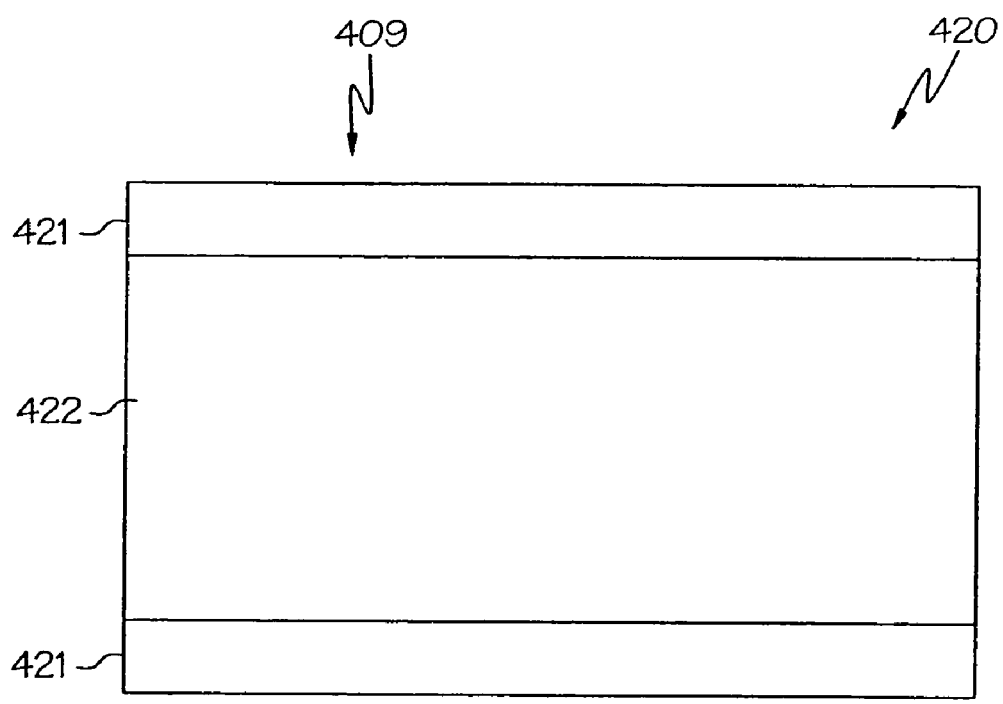
FIG. 4E is an illustration of a bottom view of a dual sided module board according to the present invention.

FIG. 4E is a bottom view of a dual sided module board 409 according to one embodiment of the invention. The module board 409 includes a pattern area 422 in between two rail areas 421. The pattern 422 is etched onto the substrate of the module board 409. The pattern creates the desired conductive connections, leads and pads on the board 409. A mask or photomask may be used to etch the pattern so as to remove conductive material. After the pattern 422 is etched, rails 421 along each edge remain and the rails 421 have not had conductive material removed during patterning. The rails 421 are partially etched or completely etched so that no continuous lengths of conductive material remains from one end of the board 409 to the other. To remove continuous lengths of conductive material from the rails 421, all of the conductive material in the rail may be removed or gaps of removed conductive material in the rail could be created. The module board 409 can be further processed by connecting integrated circuits and devices while having a reduced tendency to deform or warp compared to boards having continuous lengths of such a conductive material.

Figure 5:
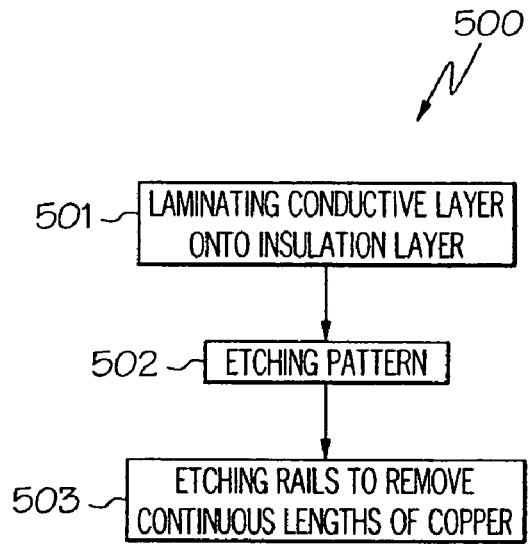
FIG. 5 is a method for fabricating a circuit board having a non-continuous conductive layer according to the present invention.

FIG. 5 is a method 500 for fabricating a circuit board having a non-continuous conductive layer according to one embodiment of the invention. A conductive layer is laminated onto an insulating layer at block 501. The conductive layer can be composed of a conductive material such as a metal such as copper. The insulating layer can be of a material such as fiberglass. A pattern is then etched into the conductive layer of the circuit board at block 502. This removes some of conductive material and creates the electrical connections and bonding or connecting pads on the circuit board. However, rails have not had any conductive material removed and contain conductive material stretching from one end of the circuit board to the other. The rails are etched to remove conductive material from the rails 503. The conductive material may be completely removed from the rails or sections or gaps of conductive material may be removed so that no continuous lengths of conductive material remain.

Figure 6:
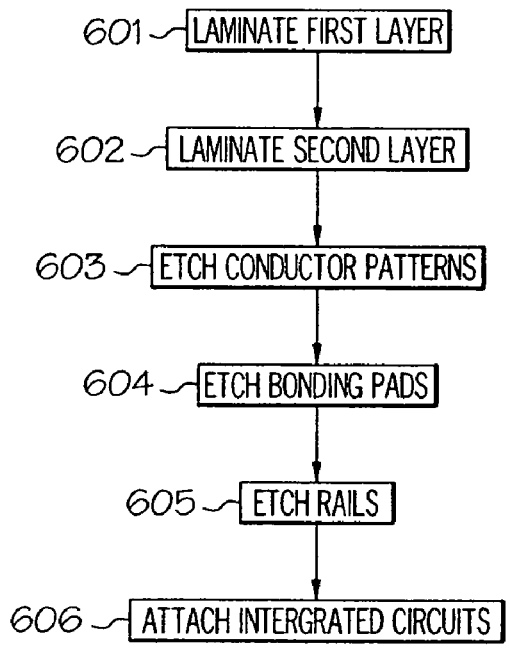
FIG. 6 is a method for fabricating an electronic device according to the present invention.

FIG. 6 is a method 600 for creating an electronic device according to one embodiment of the invention. A first conductive layer is laminated onto an insulating layer at block 601. A second conductive layer is laminated onto the opposite side of the insulating layer at block 602. Conductor patterns for a number of die sites are etched into both conductive layers at block 603. Bonding pads are also etched into the conductive layers 604. Rails having continuous lengths of conductive material remain on the edges of both conductive layers because they have not had conductive material removed from etching. The rails are then etched to remove the conductive material, at least partially such that no continuous lengths of conductive material remain on the rails 605. A continuous length of material is a strip of material that completely goes from one end of the circuit board to the other. The circuit board then continues processing and integrated circuits are attached to the die sites 606.

Figure 7:
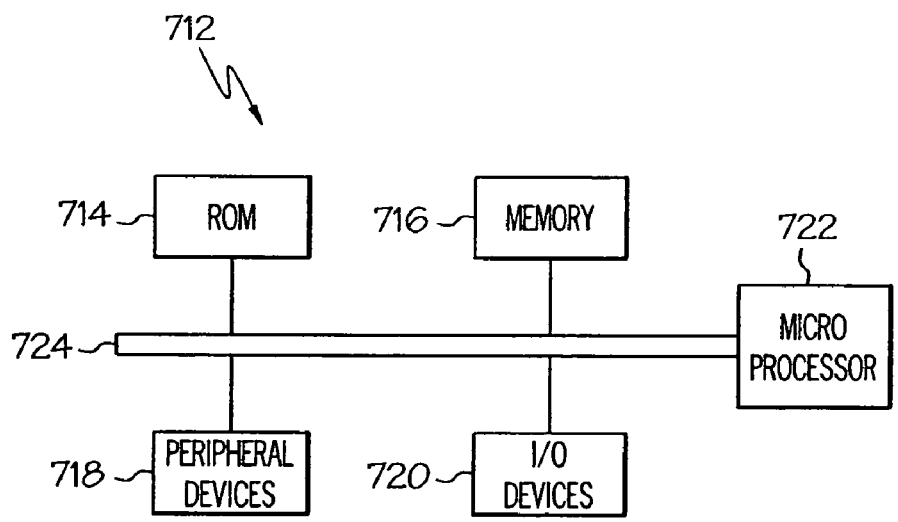
FIG. 7 is a block diagram of a typical computer system in which the invention may be used.

FIG. 7 is an illustration of a computer system 712 that can use and be used with embodiments of the present invention. As will be appreciated by those skilled in the art, the computer system 712 would include ROM 714, mass memory 716, peripheral devices 718, and I/O devices 720 in communication with a microprocessor 722 via a data bus 724 or another suitable data communication path. These devices can be fabricated according with the various embodiments of the present invention.

Having described the invention in detail and by reference to preferred embodiments thereof, it will be apparent that modifications and variations are possible without departing from the scope of the invention defined in the appended claims. For example, support and guidance structures used in packaging often have continuous layers of conductive material. Gaps or portions of conductive material can be removed from support and guidance structures to reduce deformations caused by the memory effect.

What is claimed is:

1. A method of fabricating a circuit board comprising:
   forming a first layer of conductive material over an insulating layer;
   removing portions of said conductive material of said first layer to define a first circuit pattern and a first rail area that is electrically isolated from said first circuit pattern; and,
   removing portions of said conductive material of said first layer from said first rail area such that no continuous lengths of conductive material remain within said first rail area.

2. The method of claim 1, wherein said first rail area is positioned generally adjacent to a first edge of said circuit board, and spans at least a portion of the length of said first edge.

3. A method of fabricating a circuit board comprising:
   forming a first layer of conductive material over an insulating layer;
   removing portions of said conductive material of said first layer to define a first circuit pattern and a first rail area that is electrically isolated from said first circuit pattern;
   removing portions of said conductive material of said first layer from said first rail area such that no continuous lengths of conductive material remain within said first rail area;
   removing portions of said conductive material of said first layer to define a second rail area that is electrically isolated from said first circuit pattern and said first rail area; and,
   removing portions of said conductive material of said first layer from said second rail area.

4. The method of claim 3, wherein said second rail area is positioned generally adjacent to a second edge of said circuit board, and spans at least a portion of the length of said second edge.

5. The method of claim 3, further comprising:
forming second layer of conductive material over said insulating layer opposite said first layer;
removing portions of said conductive material of said second layer to define a second circuit pattern and a third rail area that is electrically isolated from said second circuit pattern; and,
removing portions of said conductive material of said second layer from said third rail area.

6. The method of claim 5, further comprising:
removing portions of said conductive material of said second layer to define a fourth rail area that is electrically isolated from said second circuit pattern and said third rail area; and,
removing portions of said conductive material of said second layer from said fourth rail area.

7. A method of fabricating a circuit board comprising:
forming a first layer of conductive material over an insulating layer;
removing portions of said conductive material of said first layer to define a first circuit pattern and a first rail area that is electrically isolated from said first circuit pattern; and,
removing portions of said conductive material of said first layer from said first rail area such that no continuous lengths of conductive material remain within said first rail area;
forming second layer of conductive material over said insulating layer opposite said first layer;
removing portions of said conductive material of said second layer to define a second circuit pattern and a second rail area that is electrically isolated from said second circuit pattern; and,
removing portions of said conductive material of said second layer from said second rail area.

* * * * *